United States Patent
Kaneko et al.

(10) Patent No.: US 9,263,399 B2
(45) Date of Patent: Feb. 16, 2016

(54) SEMICONDUCTOR DEVICE WITH ELECTRO-STATIC DISCHARGE PROTECTION DEVICE ABOVE SEMICONDUCTOR DEVICE AREA

(75) Inventors: Kishou Kaneko, Kanagawa (JP); Naoya Inoue, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 93 days.

(21) Appl. No.: 14/002,548

(22) PCT Filed: Mar. 6, 2012

(86) PCT No.: PCT/JP2012/055707
§ 371 (c)(1),
(2), (4) Date: Aug. 30, 2013

(87) PCT Pub. No.: WO2012/121255
PCT Pub. Date: Sep. 13, 2012

(65) Prior Publication Data
US 2013/0334529 A1    Dec. 19, 2013

(30) Foreign Application Priority Data
Mar. 9, 2011  (JP) ................................. 2011-052209

(51) Int. Cl.
*H01L 23/552* (2006.01)
*H01L 27/02* (2006.01)
(Continued)

(52) U.S. Cl.
CPC .......... *H01L 23/552* (2013.01); *H01L 27/0255* (2013.01); *H01L 27/0296* (2013.01);
(Continued)

(58) Field of Classification Search
CPC ..................................................... H01L 23/552
See application file for complete search history.

(56) References Cited

U.S. PATENT DOCUMENTS 7,564,058 B2 * 7/2009 Yamazaki et al. .............. 257/72
7,687,808 B2 * 3/2010 Umezaki ......................... 257/72
(Continued)

FOREIGN PATENT DOCUMENTS

JP    60-148161 A    8/1985
JP    01-295455 A    11/1989
(Continued)

OTHER PUBLICATIONS

International Preliminary Report on Patentability issued Sep. 10, 2013 in PCT/JP2012/055707.
(Continued)

*Primary Examiner* — Thanh V Pham
(74) *Attorney, Agent, or Firm* — Sughrue Mion, PLLC

(57) ABSTRACT

A semiconductor device includes a semiconductor substrate on which a semiconductor device is formed; first and second pads; a first insulating film which is formed above the semiconductor substrate; a plurality of wiring lines which are embedded in ditches provided in the first insulating film; a second insulating film provided to cover the first insulating film and the plurality of wiring lines; a semiconductor layer formed on the second insulating film; a source electrode connected with the semiconductor layer; and a drain electrode connected with the semiconductor layer. The plurality of wiring lines includes a gate electrode provided in a position which is opposite to the semiconductor layer. The semiconductor layer, the source electrode, the drain electrode and the gate electrode configure an ESD protection device to discharge a current by ESD surge from the first pad to the second pad.

13 Claims, 25 Drawing Sheets

(51) Int. Cl.
*H01L 27/06* (2006.01)
*H01L 27/12* (2006.01)
*H01L 23/522* (2006.01)
*H01L 23/528* (2006.01)
*H01L 23/532* (2006.01)

(52) U.S. Cl.
CPC .......... *H01L27/0688* (2013.01); *H01L 27/124* (2013.01); *H01L 27/1218* (2013.01); *H01L 27/1225* (2013.01); *H01L 23/522* (2013.01); *H01L 23/5283* (2013.01); *H01L 23/53295* (2013.01); *H01L 2924/0002* (2013.01)

(56) References Cited

U.S. PATENT DOCUMENTS

| | | |
|---|---|---|
| 2005/0023692 A1 | 2/2005 | Matsunaga et al. |
| 2008/0174238 A1* | 7/2008 | Jeong et al. .................. 313/504 |
| 2008/0315197 A1 | 12/2008 | Suwa |
| 2009/0127582 A1 | 5/2009 | Matsunaga et al. |
| 2009/0212291 A1 | 8/2009 | Ikeda |
| 2010/0032664 A1 | 2/2010 | Lee et al. |
| 2010/0110623 A1 | 5/2010 | Koyama et al. |
| 2010/0133701 A1 | 6/2010 | Saiki et al. |
| 2010/0148171 A1 | 6/2010 | Hayashi et al. |
| 2010/0202090 A1 | 8/2010 | Shishido et al. |

FOREIGN PATENT DOCUMENTS

| | | |
|---|---|---|
| JP | 2005-019452 A | 1/2005 |
| JP | 2008-218818 A | 9/2008 |
| JP | 2010-041058 A | 2/2010 |
| JP | 2010-098280 A | 4/2010 |
| JP | 2010-129958 A | 6/2010 |
| JP | 2010-135762 A | 6/2010 |
| JP | 2010-141174 A | 6/2010 |
| JP | 2010-141230 A | 6/2010 |
| JP | 2010-206186 A | 9/2010 |
| WO | 2010/030532 A1 | 3/2010 |

OTHER PUBLICATIONS

Japanese Office Action issued Apr. 2, 2014 in corresponding Japanese Patent Application No. 2013-503558.

International Search Report for PCT/JP2012/055707, dated Jun. 5, 2012.

Communication dated Aug. 5, 2015 from the State Intellectual Property Office of the P.R.C. in counterpart application No. 201280012204.6.

* cited by examiner

SEMICONDUCTOR DEVICE WITH ELECTRO-STATIC DISCHARGE PROTECTION DEVICE ABOVE SEMICONDUCTOR DEVICE AREA

CROSS REFERENCE TO RELATED APPLICATIONS

This application is a National Stage of International Application No. PCT/JP2012/055707 filed Mar. 6, 2012, claiming priority based on Japanese Patent Application No. 2011-052209 filed Mar. 9, 2011, the contents of all of which are incorporated herein by reference in their entirety.

TECHNICAL FIELD

The present invention relates to a semiconductor device, and especially to a semiconductor device provided with an electro-static discharge (ESD) protection device.

BACKGROUND ART

An ESD protection device is generally integrated in a semiconductor device, to protect the semiconductor device provided with an integrated circuit from an ESD surge. The ESD protection device needs to use active elements such as a transistor and a diode, to attain an active operation like a variable resistance.

In a general semiconductor device, because an active element is formed in the semiconductor substrate (e.g. a silicon substrate), the transistor or the diode, which is formed on the semiconductor substrate, is used for the ESD protection device. FIG. 1 is a sectional view showing an example of the structure of such a semiconductor device. The semiconductor device 100 of FIG. 1 is composed of a logic region 100A and the ESD protection device region 100B.

The logic region 100A is a region where a logic circuit and an integrated circuit are formed. In detail, a semiconductor element 102 such as a MOS transistors is formed in a part of the logic region 100A of a semiconductor substrate 101, and a plurality of wiring layers (6 wiring layers in FIG. 1) 103 are provided above it. Each of the wiring layers 103 is composed of wiring lines 104 and an interlayer insulating film 105 which electrically separates the wiring lines 104 from wiring lines of the adjacent wiring layer 103. The semiconductor element 102, the wiring lines 104 of the lowermost wiring layer 103 are the wiring line 104, and the wiring lines 104 of the two neighbor wiring layers 103 are electrically connected by via-contacts 106 provided to pass through the interlayer insulating films 105. The integrated circuit is formed from the semiconductor element 102, the wiring lines 104 and the via-contacts 106.

On the other hand, the ESD protection device region 100B is a region where the ESD protection device 107 is formed. The ESD protection device 107 is formed in a part of the ESD protection device region 100B of the semiconductor substrate 101. An active element is used for the ESD protection device 107, and a thyristor having a PNPN structure is formed as the ESD protection device 107 in an example of FIG. 1. The ESD protection device 107 is connected with an I/O pad and a ground pad provided in the uppermost wiring layer 103 through the wiring lines 104 and the via-contacts 106 provided in each wiring layer 103. In FIG. 1, the wiring lines connected with the I/O pad are shown by a reference numeral 108 and the wiring lines connected with the ground pad are shown by a reference numeral 109. When an ESD surge is applied to the I/O pad, the ESD protection device 107 is turned on to pass the ESD surge to the ground pad. The internal integrated circuit is protected from the ESD surge through such an operation.

As shown in FIG. 1, one problem of the semiconductor element, which uses the transistor or diode formed on the semiconductor substrate, as the ESD protection device is to cause the increase of the chip area for forming the ESD protection device. Because the ESD protection device is formed on the semiconductor substrate, the area to form the ESD protection device must be provided separately from the area for forming the integrated circuit. This leads the increase of the chip area. Moreover, when the ESD surge is applied, the transistor or diode having a large area must be formed as the ESD protection device because a large amount of current can flow through the ESD protection device. This makes a problem of the increase of the chip area increasingly more serious.

It should be noted that JP 2010-141230A discloses a technique of forming a semiconductor device using a semiconductor layer provided in a wiring layer, as the technique related to the present invention. As a material of the semiconductor layer, oxide semiconductor such as InGaZnO (IGZO) and ZnO, polysilicon, and amorphous silicon are exemplified. As an application of the semiconductor device provided in the wiring layer, a transistor as a switching element is exemplified. Also, a technique is disclosed in which a trap film and a back gate electrode are provided for the semiconductor device and the semiconductor device is used as a memory device. JP 2010-141230A describes nothing about the ESD protection.

Moreover, JP 2010-41058A, JP 2010-98280A and JP 2010-135762A disclose thin film transistors having oxide semiconductor films. In the techniques disclosed in these references, the thin film transistor having an oxide semiconductor film is used for active matrix display unit such as a liquid crystal display.

CITATION LIST

[Patent literature 1] JP 2010-141230A
[Patent literature 2] JP 2010-41058A
[Patent literature 3] JP 2010-98280A
[Patent literature 4] JP 2010-135762A

SUMMARY OF THE INVENTION

Therefore, one object of the present invention is to reduce a chip size of a semiconductor device having an ESD protection device.

In one aspect of the present invention, a semiconductor device includes a semiconductor substrate on which a semiconductor element is formed, a first and second pads; a first insulating film formed above the semiconductor substrate; a plurality of wiring lines embedded in ditches provided in the first insulating film; a second insulating film provided to cover the first insulating film and the plurality of wiring lines; a semiconductor layer formed on the second insulating film; a source electrode connected with the semiconductor layer; and a drain electrode connected with the semiconductor layer. A plurality of wiring lines include a gate electrode provided in a position opposite to the semiconductor layer. The semiconductor layer, the source electrode, the drain electrode and the gate electrode configure an ESD protection device to discharge a current due to an ESD surge from the first pad to the second pad.

According to the present invention, the chip size of the semiconductor device of the ESD protection device can be reduced.

DESCRIPTION OF EMBODIMENTS

Figure 2:
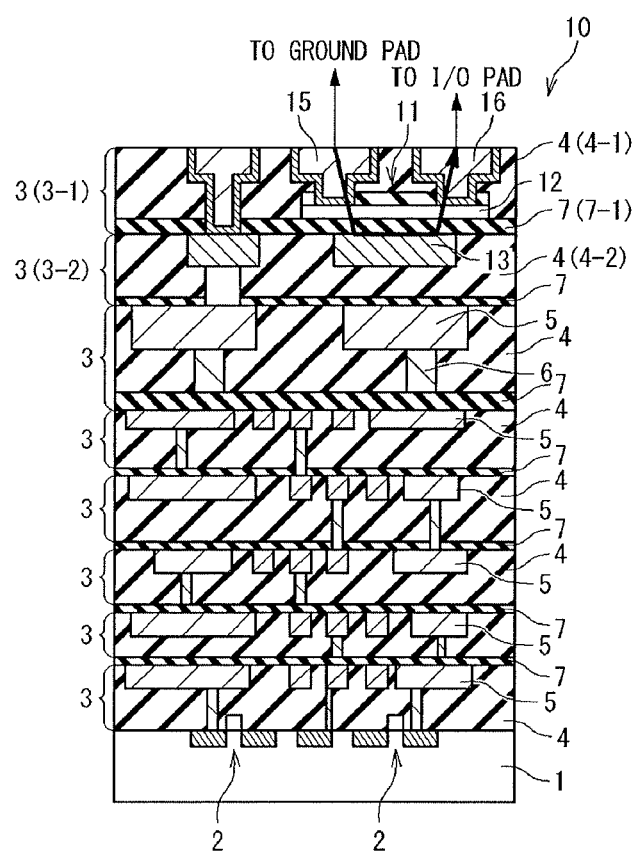
FIG. 2 is a sectional view showing a structure of the semiconductor device according to an embodiment of the present invention.

FIG. 2 is a sectional view showing the structure of a semiconductor device 10 according to one embodiment of the present invention. A semiconductor element 2 such as a MOS transistor is formed in a surface section of a semiconductor substrate 1, on which a plurality of wiring layers 3 are formed. In the present embodiment, for example, a silicon substrate is used as the semiconductor substrate 1. Each of the wiring layers 3 is composed of an interlayer insulating film 4 and wiring lines 5 embedded in ditches provided for the surface section of the insulating film 4. In the present embodiment, the wiring lines 5 in the uppermost wiring layer 3 are aluminum wiring lines and the wiring lines 5 in the remaining wiring layers 3 are copper wiring lines. Also, the number of wiring layers 3 is 8. For example, the low permittivity insulating layer having a permittivity lower than silicon oxide is used as the interlayer insulating film 4. For example, as the low permittivity insulating layer, a SiOC film, a SiLK film (SiLK is the registered trademark), an HSQ (hydrogen silsesquioxane) film, a MHSQ (methylated hydrogen silsesquioxane) film, a MSQ (methyl silsesquioxane) film or a porous film of any of them can be used. The semiconductor element 2, the wiring lines 5 in the lowermost wiring layer 3, and the wiring lines 5 of the two neighbor wiring layers 3 are electrically connected by via-contacts 6 which are provided to pass through the interlayer insulating film 4.

There is a case that the uppermost wiring layer 3 is referred to as a wiring layer 3-1 and the second wiring layer 3 from the top is referred to as a wiring layer 3-2. The uppermost interlayer insulating film 4 is referred to as an interlayer insulating film 4-1, and the second interlayer insulating film 4 from the top is referred to as an interlayer insulating film 4-2.

In addition, the interlayer insulating films 4 except for the uppermost interlayer insulating film 4-1 and the wiring lines 5 embedded in them are covered with diffusion preventing layers 7. The diffusion preventing layer 7 is an insulating film to prevent the diffusion of a material (especially, copper of a copper wiring line) of the wiring lines 5. For example, as the diffusion preventing layer 7, a SiN film, a $SiO_2$ film and a SiCN film can be used. For example, the thickness of diffusion preventing layer 7 is in a range of 10 to 50 nm. It should be noted that there is a case that the uppermost diffusion preventing layer 7 is referred to as a diffusion preventing layer 7-1.

Figure 3:
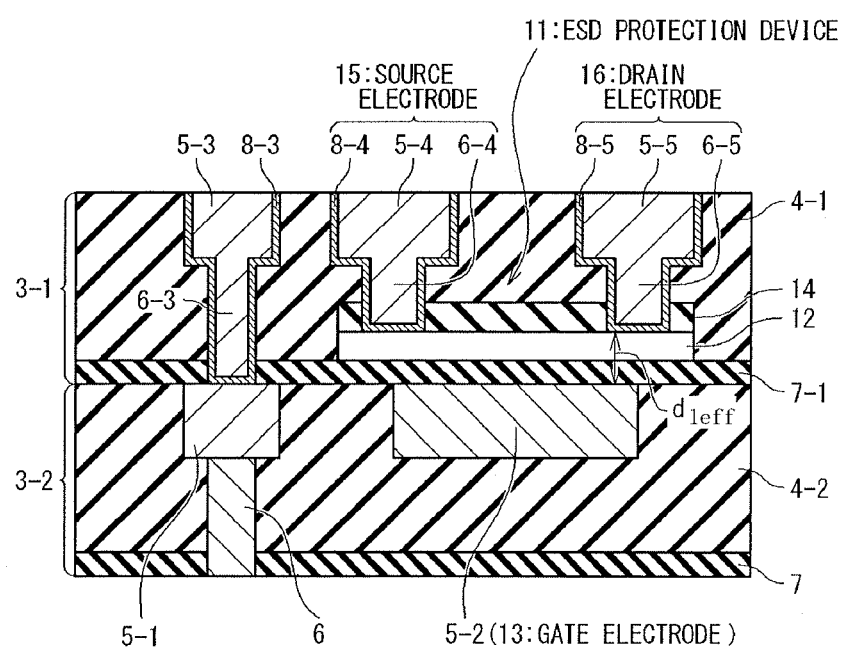
FIG. 3 is a sectional view showing a structure near the ESD protection device in the semiconductor device of FIG. 2.

One feature of the semiconductor device 10 of the present embodiment is in that a semiconductor layer 12 is formed in addition to the semiconductor substrate 1, and an active element which is formed by using the semiconductor layer 12 is used for an ESD protection device 11. In the present embodiment, a thin film transistor is used for ESD protection device 11. FIG. 3 is a sectional view showing the structure of the ESD protection device 11 and the semiconductor device 10 around it.

The wiring ditches are formed in the second interlayer insulating film 4-2 and the wiring lines 5-1 and 5-2 are embedded in those wiring ditches. In the present embodiment, both of the wiring lines 5-1 and 5-2 are copper wiring lines and are formed by using the damascene method in an identical wiring line forming process. The wiring line 5-2 is used as a gate electrode of the thin film transistor used as the ESD protection device 11 to be described later. Therefore, there is a case that the wiring line 5-2 is referred to as the gate electrode 13.

The semiconductor layer 12 is formed on the diffusion preventing layer 7-1 to oppose to the gate electrode 13. In the present embodiment, the semiconductor layer 12 is formed of oxide semiconductor such as InGaZnO (IGZO), InZnO (IZO), ZnO, ZnAlO, and ZnCuO. It is possible to form these oxide semiconductor layers at a comparatively lower temperature (at a temperature equal to or less than 400° C.). The advantage is in that the semiconductor layer 12 can be formed at the temperature which conforms to the general wiring line processing used to form the wiring layer 3 below the semiconductor layer 12, when the semiconductor layer 12 is formed of any of these oxide semiconductors.

A hard mask layer 14 is formed on the semiconductor layer 12. The hard mask layer 14 is an insulating film which is used as a mask in a patterning process of the semiconductor layer 12, and for example, a $SiO_2$ film and a SiN film are used as the hard mask layer 14. The hard mask layer 14 plays a role to prevent the semiconductor layer 12 from being reduced in the manufacturing process of the semiconductor device 10. The uppermost interlayer insulating film 4-1 is formed to cover the semiconductor layer 12 and the hard mask layer 14.

Wiring ditches and via-holes are formed in the interlayer insulating film 4-1 and the wiring ditches and the via-holes are covered with barrier metal layers 8-3 to 8-5. The barrier metal layer 8-3 is formed to contact the wiring line 5-1 of the wiring layer 3-2, and the barrier metal layers 8-4 and 8-5 are formed to contact the semiconductor layer 12. For example, as the material of the barrier metal layers 8-3 to 8-5, Ti, Ta, Ru, W, and nitride or oxide of them are exemplified. The barrier metal layers 8-3 to 8-5 may be a single layer formed of any of these materials and may be a laminate layer of two or more layers of any of these materials. For example, as an example of the laminate barrier metal layers 8-3 to 8-5, the laminate layer of TiN (upper layer)/Ti (lower layer), or TaN (upper layer)/Ta (lower layer) is exemplified. The barrier metal layers 8-3 to 8-5 are collectively formed in an identical forming process. The barrier metal layers 8-4 and 8-5 are formed to have ohmic contacts in the contact sections with the semiconductor layer 12.

The wiring lines 5-3 to 5-5 and via-contacts 6-3 to 6-5 are formed in the wiring ditches and the via-holes covered with the barrier metal layers 8-3 to 8-5. The wiring lines 5-3 to 5-5 are the wiring lines belonging to the wiring layer 3-1. The wiring lines 5-3 to 5-5 and the via-contacts 6-3 to 6-5 are collectively formed in the identical forming process. The wiring line 5-3 is connected with the wiring line 5-1 in the wiring layer 3-2 through the via-contact 6-3. On the other hand, the wiring lines 5-4 and 5-5 are connected with the semiconductor layer 12 through the via-contacts 6-4 and 6-5, respectively.

The wiring line 5-4, the via-contact 6-4 and the barrier metal layer 8-4 are used as a source electrode of the thin film transistor which is used as the ESD protection device 11, to be mentioned later. They are called the source electrode 15 generically. On the other hand, the wiring line 5-5, the via-contact 6-5 and the barrier metal layer 8-5 are used as a drain electrode of the thin film transistor. They are called the drain electrode 16 generically.

In the semiconductor device 10 having the above structure, the wiring lines 5-1 and 5-3, and the via-contact 6-3 is integrated in the semiconductor device 10 as the components of the integrated circuit. On the other hand, the semiconductor layer 12, the gate electrode 13, the source electrode 15, the drain electrode 16 and a diffusion preventing layer 7-1 configure the thin film transistor. At this time, a part of the diffusion preventing layer 7-1 which is located between the semiconductor layer 12 and the gate electrode 13 functions as the gate insulating film. In the present embodiment, the thin film transistor of such a structure is used for the ESD protection device 11. When the semiconductor layer 12 is formed of the oxide semiconductor such as InGaZnO (IGZO), InZnO (IZO), ZnO, ZnAlO, and ZnCuO, the semiconductor layer 12 functions as an N-type semiconductor, and the ESD protection device 11 operates as the thin film transistor having electrons as carriers.

Figure 4A:
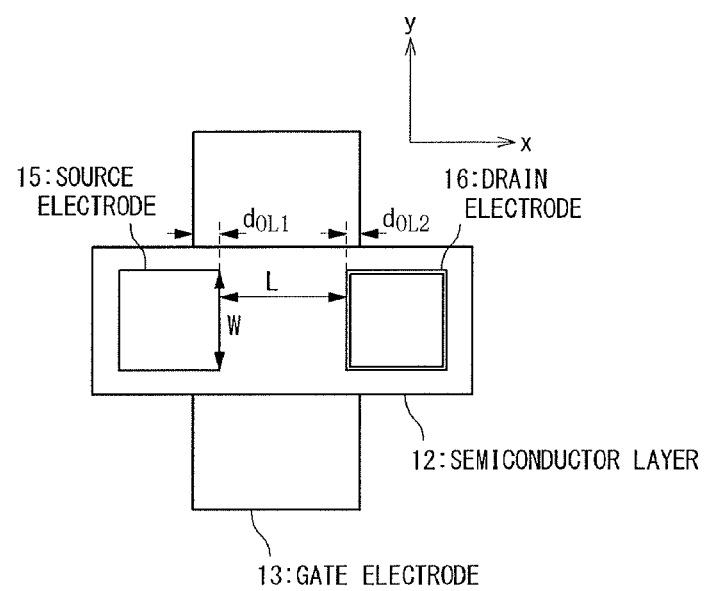
FIG. 4A is a layout diagram showing a planar layout of the ESD protection device in the semiconductor device of FIG. 2.

FIG. 4A is a plan view showing an example of a planar layout of the semiconductor layer 12, the gate electrode 13, the source electrode 15 and the drain electrode 16. Here, in FIG. 4A, an X-axis is defined in a direction from the source electrode 15 toward the drain electrode 16 and a Y-axis is defined to be orthogonal to the X axis. A part of the semiconductor layer 12 between the source electrode 15 and the drain electrode 16 is opposite to the gate electrode 13 and this part is used as a channel region. In the planar layout of FIG. 4A, a contact plane of each of the source electrode 15 and the drain electrode 16 and the semiconductor layer 12 has an identical rectangular shape. A distance between the source electrode 15 and the drain electrode 16 along the semiconductor layer 12 is a gate length L of the thin film transistor and a width in the Y direction of the contact plane of the source electrode 15, the drain electrode 16 and the semiconductor layer 12 is a gate width W.

FIG. 4A shows a planar layout in which a part of each of the source electrode 15 and the drain electrode 16 overlaps with the gate electrode 13. In FIG. 4A, the overlap length of the source electrode 15 to the gate electrode 13 is shown by a symbol $d_{OL1}$, and the overlap length of the drain electrode 16 to the gate electrode 13 is shown by a symbol $d_{OL2}$. Here, the overlap length is a distance from the end of the source electrode 15 or the drain electrode 16 to the end of the gate electrode 13 in a plane.

Figure 4B:
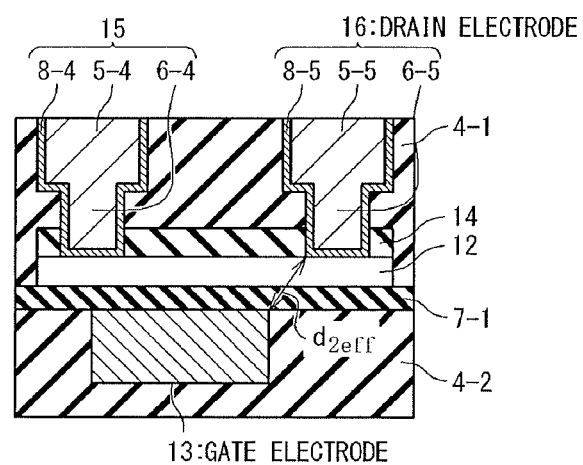
FIG. 4B is a sectional view showing another structure near the ESD protection device of the semiconductor device in the embodiment.
Figure 4C:
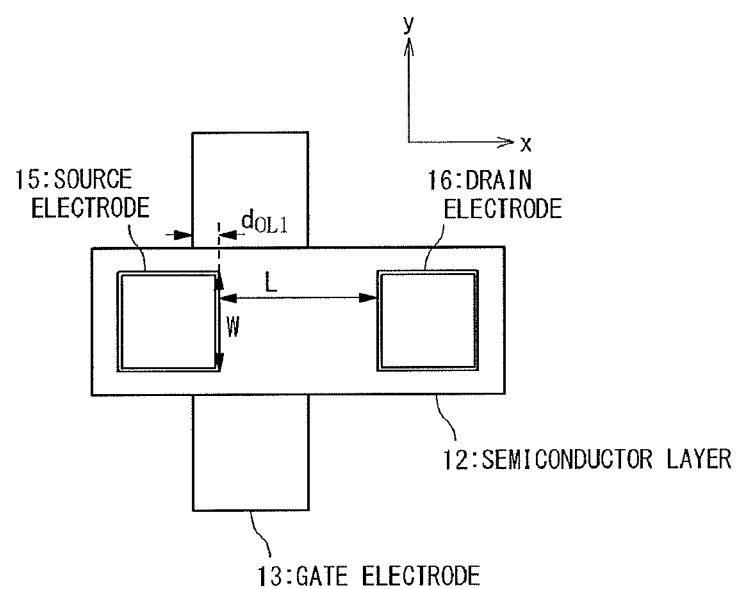
FIG. 4C is a layout diagram showing a planar layout of the ESD protection device in the semiconductor device of FIG. 4B.

Another planar layout may be used in which the source electrode 15 and the drain electrode 16 do not overlap with the gate electrode 13. Especially, as shown in FIG. 4B and FIG. 4C, it is effective in increase of a breakdown voltage between the drain electrode 16 and the gate electrode 13 to adopt the structure that the drain electrode 16 does not overlap with the gate electrode 13 (that is, the structure that the contact plane between the drain electrode 16 and the semiconductor layer 12 does not overlap with the gate electrode 13 in the perpendicular direction to the semiconductor substrate 1). As shown in FIG. 4B and FIG. 4C, in the structure that the drain electrode 16 does not overlap with the gate electrode 13, the distance $d_{\mathit{eff}}$ between the drain electrode 16 and the gate electrode 13 becomes large. The effective electric field intensity applied to the end of the gate electrode due to the drain voltage is reduced rather than the overlapping structure, by increasing the distance. Therefore, it is possible to effectively increase the breakdown voltage between the drain electrode 16 and the gate electrode 13.

Figure 5A:
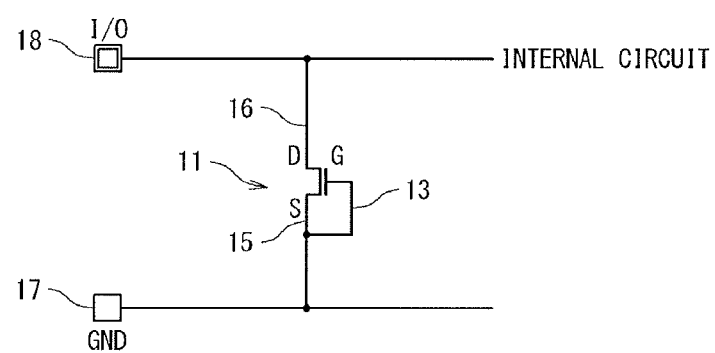
FIG. 5A is a circuit diagram showing an example of a use mode of the ESD protection device in the semiconductor device of the present invention.
Figure 5B:
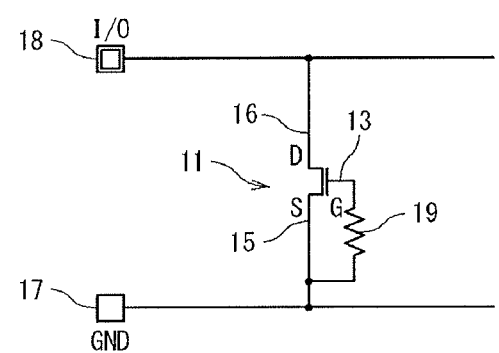
FIG. 5B is a circuit diagram showing another example of the use mode of the ESD protection device in the semiconductor device of the present invention.

FIG. 5A and FIG. 5B are schematically showing a use example of the ESD protection device 11 in the semiconductor device 10. In one embodiment, as shown in FIG. 5A, the gate electrode 13 of the ESD protection device 11 is connected to the source electrode 15, and the gate electrode 13 and the source electrode 15, which are connected in common, are connected with a ground pad 17. On the other hand, the drain electrode 16 of the ESD protection device 11 is connected with an I/O pad 18 to input and output a signal. According to such a connection, the ESD protection device 11 functions as a gate-grounded type N-channel transistor. As shown in FIG. 5B, moreover, a resistance element 19 may be connected with the gate electrode 13. As an example, the resistance element 19 may be realized with a wiring line resistance.

Various advantages are in the structure of the above-explained semiconductor device 10 of the present embodiment. First, a chip area can be reduced according to the structure of the semiconductor device 10 of the present embodiment. The structure of the semiconductor device 100 shown in FIG. 1 needs to provide the ESD protection device area 100B in addition to a logic circuit area 100A. On the other hand, because in the semiconductor device 10 of the present embodiment, the ESD protection device 11 can be formed above the semiconductor device 2 area of the semiconductor substrate 1, it is not necessary to provide the exclusive-use area for the ESD protection device 11. This is effective in the reduction of the chip area.

In addition, in the ESD protection device 11 having the structure in the present embodiment, there is an advantage that it is possible to adjust the breakdown voltage in a wide range. The breakdown voltage between the gate electrode 13 and the drain electrode 16 can be adjusted in a wide range by appropriately selecting a material and a film thickness of the diffusion preventing layer 7-1. Moreover, as shown in FIG. 4B and FIG. 4C, when the drain electrode 16 does not overlap with the gate electrode 13, it is possible to adjust the breakdown voltage between the gate electrode 13 and the drain electrode 16 based on the distance between the drain electrode 16 and the gate electrode 13.

Especially, the ESD protection device 11 of the present embodiment can be designed as high breakdown voltage device as the result of breakdown voltage adjustment. First, if the film thickness of the diffusion preventing layer 7-1 is made thick, the breakdown voltage between the drain electrode 16 and the gate electrode 13 can be increased. Also, when the drain electrode 16 does not overlap with the gate electrode 13 as shown in FIG. 4B, the breakdown voltage between the gate electrode 13 and the drain electrode 16 can be increased by increasing the distance of the drain electrode 16 and the gate electrode 13. Moreover, it is possible to increase the breakdown voltage between the source electrode 15 and the drain electrode 16 by selecting a material having a large band gap as the semiconductor layer 12. For example, generally, because an oxide semiconductor has a band gap which is larger than the band gap (about 1.2 eV) of silicon, the breakdown voltage between the gate electrode 13 and the drain electrode 16 can be made large by using the oxide semiconductor as the semiconductor layer 12. For example, the band gap of InGaZnO (IGZO) is in a range of 3.3 to 3.4 eV and other oxide semiconductors such as InZnO (IZO), ZnO, ZnAlO, and ZnCuO have the band gap of equal to or more than 3.2 eV. In this way, according to the structure of the ESD protection device 11 in the present embodiment, the ESD protection device having the breakdown voltage of 20 to 100 V, which is difficult in a CMOS integrated circuit using a general silicon semiconductor substrate, can be realized, depending on the design.

Figure 1:
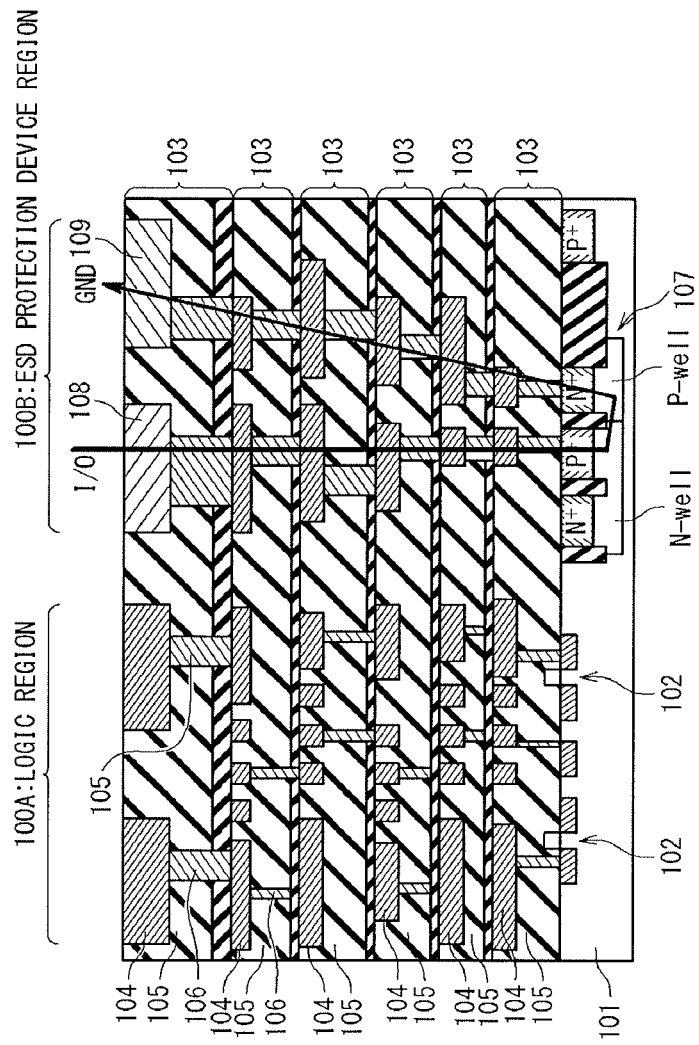
FIG. 1 is a sectional view showing a structure example of a semiconductor device provided with an ESD protection device.

Moreover, there is an advantage that ESD surge does not reach the semiconductor substrate 1, in the semiconductor device 10 of the present embodiment. In the structure that the ESD protection device 107 is provided in the semiconductor substrate 101, when the ESD surge is applied to a pad (an I/O pad in FIG. 1) as shown by an arrow in FIG. 1, there is a possibility that a large current flows through the semiconductor substrate 101. When the large current flows through the semiconductor substrate 101, there is a possibility that a local heating due to the power consumption happens so that the heat destruction occurs in the semiconductor substrate 101 (e.g. the silicon substrate) due to this heat. On the other hand, in the present embodiment, a current due to the ESD surge can be passed to the ground pad 17 without flowing through the semiconductor substrate 1, so that the heat destruction of the semiconductor substrate 1 can be prevented. Moreover, by using both of the conventional ESD protection device as shown in FIG. 1 and the ESD protection device 11 of the present embodiment, the structure is made possible in which the ESD surge passed to the semiconductor substrate can be eased. According to such a structure, the characteristics of the ESD protection device can be improved without increasing a chip area.

Figure 6:
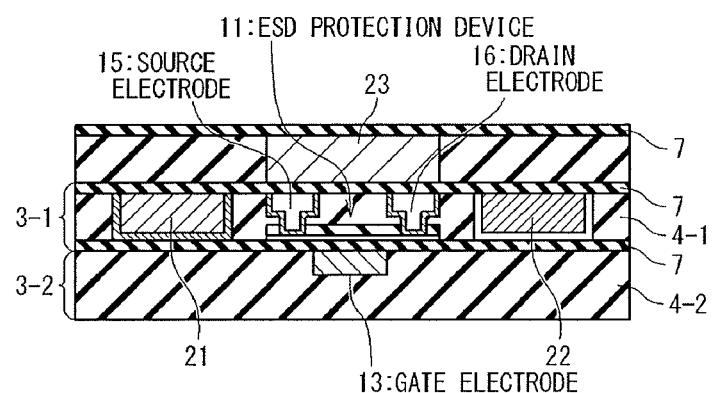
FIG. 6 is a sectional view showing a modification example of the semiconductor device of the present invention.

When the ESD protection device 11 provided in the wiring layer 3 is used like the present embodiment, it is expected that heat is generated locally in the ESD protection device 11 and the wiring lines 5 of the wiring layer 3 through application of large electric current and large voltage. To cope with this problem, a metal wiring line having a high thermal conductivity (e.g. Cu wiring line and Al wiring line) may be formed in the neighborhood of the ESD protection device 11 as a heat radiation route. FIG. 6 is a sectional view showing an example of the structure in which the metal wiring line with a high thermal conductivity is provided for the neighborhood of the ESD protection device 11. In the structure shown in FIG. 6, wiring lines 21 and 22 for heat radiation are formed in the same wiring layer 3-1 as the source electrode 15 and the drain electrode 16. Also, a wiring line 23 for heat radiation is formed in the wiring layer 3 above the wiring layer 3-1 in which the source electrode 15 and the drain electrode 16 are formed. In this way, by adopting the structure which eases the heat generated locally in the ESD protection device 11 and the wiring layer 3 by the wiring lines 21 to 23, the heat tolerance and the reliability of the ESD protection device 11 can be improved. The wiring lines 21 to 23 may be used as a power supply line, a ground line, and a signal wiring line, and may be for exclusive-use of heat radiation. When the wiring lines 21 to 23 are for the exclusive use of heat radiation, they are not necessary to be connected with other wiring line 5 and another device.

The above-mentioned ESD protection device 11 may be used for protection of an internal circuit from the ESD surge. Here, the internal circuit is a circuit which uses an active element (mainly, a MOS transistor) formed on the semiconductor substrate 1, a circuit which uses an active element formed in the wiring layer 3 which is above the semiconductor substrate 1 (active element using a semiconductor layer formed in the wiring layer 3), and a circuit which contains both of the active element formed on the semiconductor substrate 1 and the active element formed in the wiring layer 3.

Figure 12:
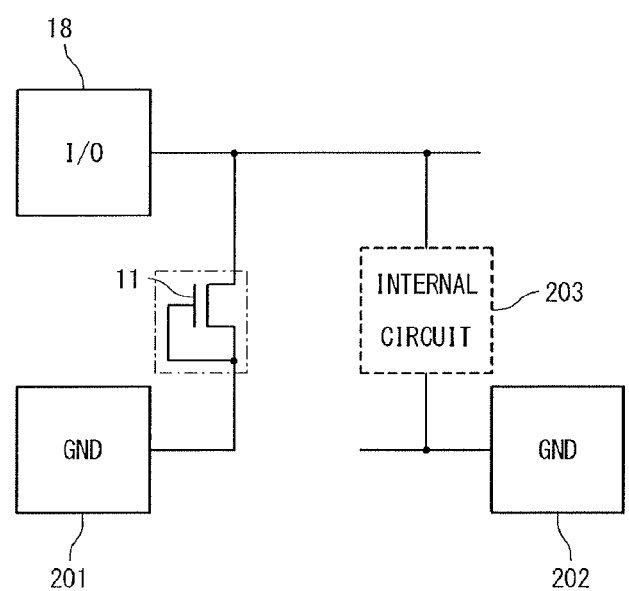
FIG. 12 is a circuit diagram showing an example of the circuit structure which uses the ESD protection device for protection of an internal circuit.

FIG. 12 shows an example of a circuit configuration using the above-mentioned ESD protection device 11 for protection of the internal circuit 203 from an ESD surge. In the circuit configuration of FIG. 12, the ground of the ESD protection device 11 and the ground of the internal circuit 203 are separated, a ground pad 201 is connected with the ESD protection device 11 and a ground pad 202 is connected with the internal circuit 203. It becomes possible to surely flow a large capacity of current to the ground pad 201 which is connected with the ESD protection device 11, by separating the ground of the ESD protection device 11 and the ground of the internal circuit 203. When a common ground is provided for the ESD protection device 11 and the internal circuit 203, there is a fear that a voltage above the operation voltage is applied to the internal circuit 203 for a moment. However, by separating the grounds, the problem can be avoided. Thus, the reliability to the ESD surge can be improved.

Figure 13:
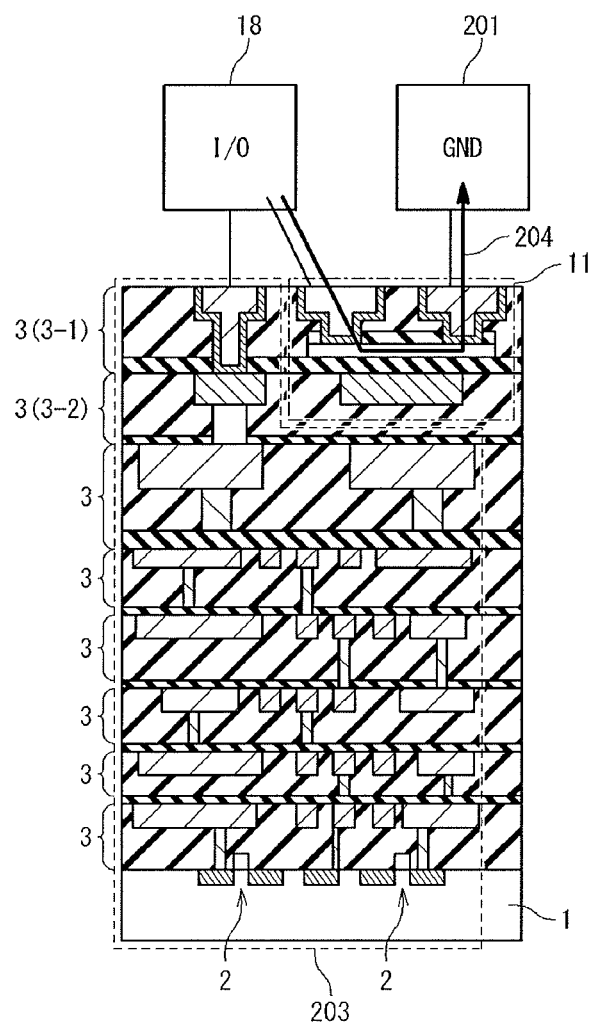
FIG. 13 is a sectional view showing an example of the structure of the semiconductor device having the circuit configuration in FIG. 12.

FIG. 13 is a sectional view showing an example of the structure of the semiconductor device of the circuit configuration shown in FIG. 12. In this case of FIG. 13, the I/O pad 18 is connected with both of the internal circuit 203 and the ESD protection device 11, but the present invention is not limited to such a configuration. When the ESD surge 204 enters from the I/O pad 18, the current flows through the ESD protection device 11 formed in the wiring layer 3. That is, without the ESD surge 204 invading the internal circuit 203 which contains the semiconductor device 2 formed on the semiconductor substrate 1, the ESD surge 204 can be made to flow into the ground pad 201 connected with the ESD protection device 11. Thus, the destruction of the internal circuit 203 can be prevented.

Figure 14:
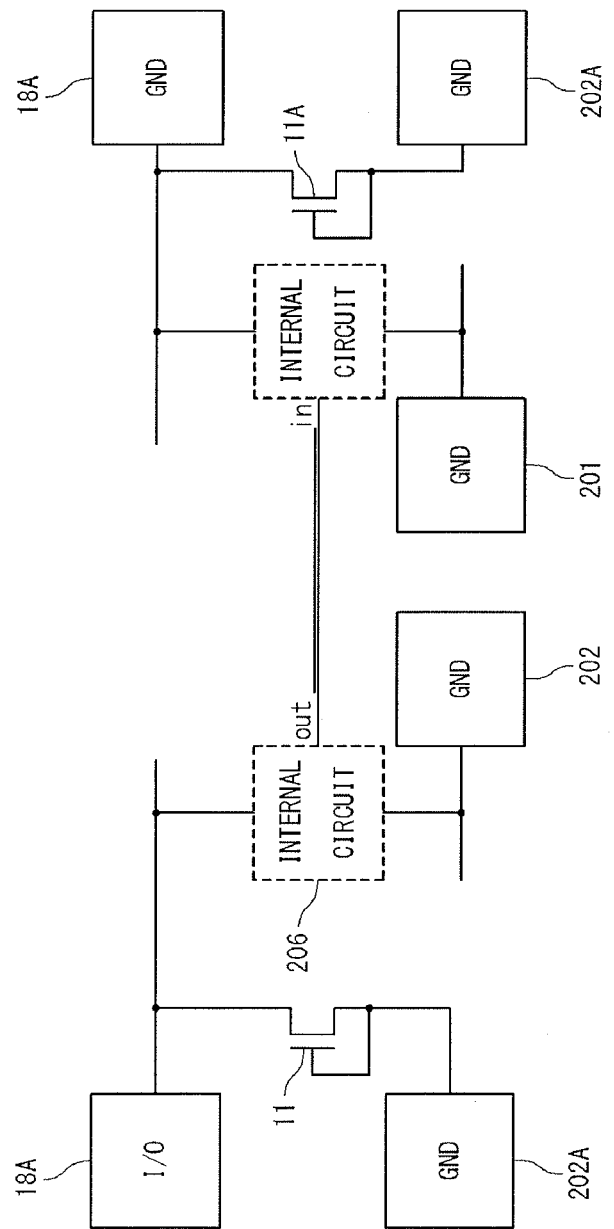
FIG. 14 is a circuit diagram showing another example of the circuit configuration which uses an the ESD protection device for protection of the internal circuit.

FIG. 14 shows an example of the circuit configuration of the semiconductor device which contains both of an internal circuit 206 which uses the active elements formed on the semiconductor substrate 1 and an internal circuit 207 which uses the active elements formed in the wiring layer 3. The active element formed in the wiring layer 3 means an active element formed by using the semiconductor layer formed in the wiring layer 3, like the ESD protection device 11. The internal circuits 206 and 207 are electrically connected and an output signal from the active element formed in the semiconductor substrate 1 is supplied to the active element formed in the wiring layer 3. It should be noted that the active element formed in the semiconductor substrate 1 and the active element formed in the wiring layer 3 may function separately without being electrically connected. When the operation voltage of the internal circuit 206 which uses the active element formed in the semiconductor substrate 1 and that of the internal circuit 207 which uses the active element formed in the wiring layer 3 are different from each other, I/O pads may be provided separately. In the circuit configuration of FIG. 14, the I/O pad 18 connected with the internal circuit 206 and the I/O pad 18A connected with the internal circuit 207 are provided separately. In this case, it is desirable to connect the ESD protection device with each of the I/O pads 18 and 18A. In the circuit configuration of FIG. 14, the ESD protection devices 11 and 11A are connected with the I/O pads 18 and 18A respectively connected with the internal circuits 206 and 207.

Figure 15:
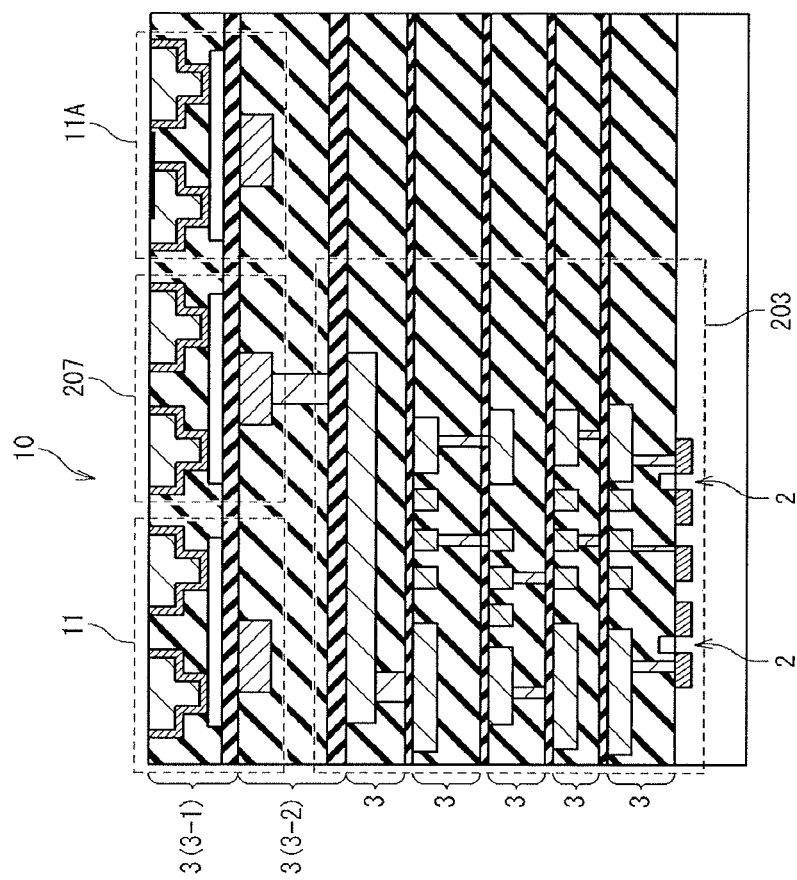
FIG. 15 is a sectional view showing an example of the structure of the semiconductor device having the circuit configuration in FIG. 14.

FIG. 15 is a sectional view showing an example of the structure of the semiconductor device having the circuit configuration of FIG. 14. In the structure of FIG. 15, the internal circuit 206 which uses the active element formed in the semiconductor substrate 1, and the internal circuit 207 which uses the active element formed in the wiring layer 3 are electrically connected. Moreover, the ESD protection devices 11 and 11A are provided to protect the internal circuits 206 and 207.

Below, an experiment result showing the characteristics of the ESD protection device 11 which was actually made as an example will be described.

EXAMPLES

Figure 7A:
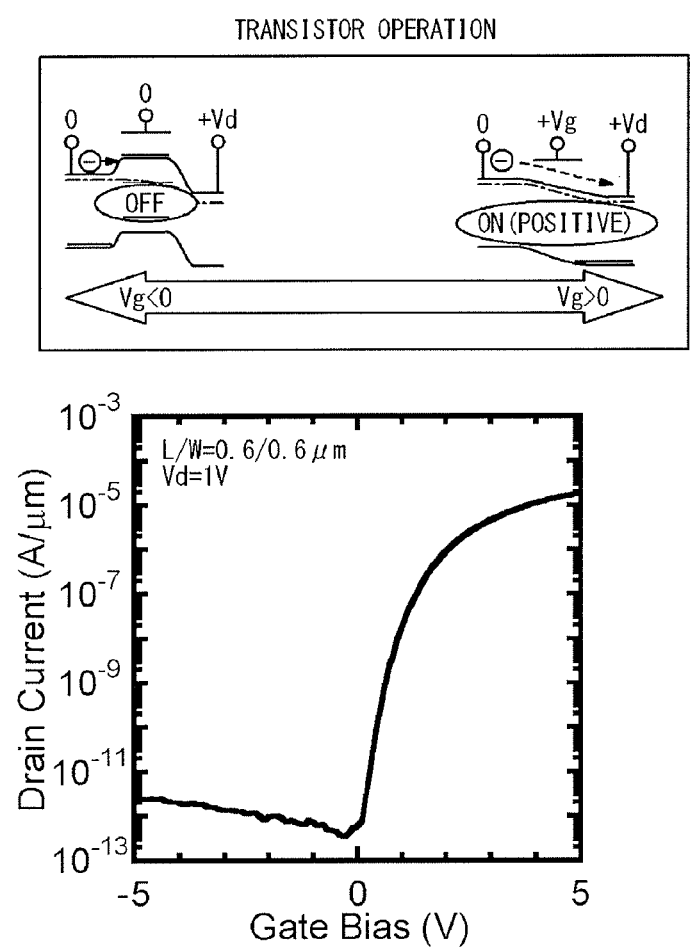
FIG. 7A is a graph showing a transistor operation characteristic of the ESD protection device in the embodiment of the present invention.
Figure 7B:
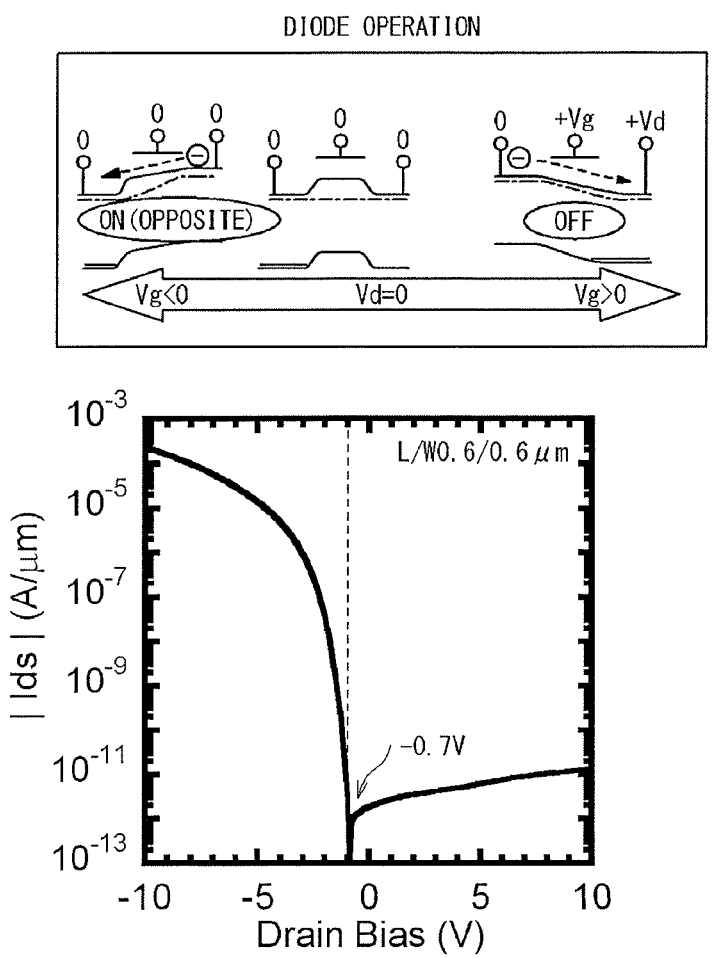
FIG. 7B is a graph showing a diode operation characteristic of the ESD protection device in the embodiment of the present invention.

FIG. 7A is a graph showing an example of the characteristics of the ESD protection device 11 operating like a transistor, and FIG. 7B is a graph showing an example of the characteristics of the ESD protection device 11 operating like a diode. In the measured ESD protection device 11, the semiconductor layer 12 is formed of IGZO, and also 20-nm SiN is used as the gate insulating film (diffusion preventing layer 7-1). As shown in FIG. 7A, the drain current flows when a positive voltage bias is applied to the gate electrode 13 in the state that the source voltage (the voltage of the source electrode 15) is fixed to 0 V and the drain voltage Vd (the potential of the drain electrode 16) is fixed to 1 V, whereas the drain current is blocked off when a negative voltage bias is applied to the gate electrode. This result means that the ESD protection device 11 operates like a transistor actually. On the other hand, as shown in FIG. 7B, the drain current is blocked off when a positive voltage bias is applied to the drain electrode 16 in the state that the gate electrode 13 and the source electrode 15 are fixed to 0 V (this means a diode connection of the ESD protection device 11), whereas the drain current flows when a negative voltage bias is applied to the drain electrode 16. In an example of FIG. 7B, the ON voltage is −0.7 V. This result means that the ESD protection device 11 operates like a diode (carries out the rectifying operation) actually. In this way, the inventors confirmed that the ESD protection device 11 prepared in the wiring layer 3 operates actually as the active element (the transistor or the diode) through the experiment.

Figure 8A:
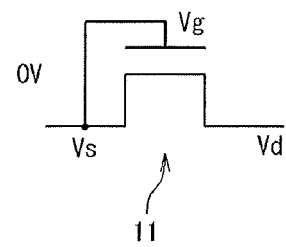
FIG. 8A is a circuit diagram showing a terminal connection of the ESD protection device whose breakdown voltage is measured.

As described above, the advantage of the ESD protection device 11 of the present embodiment is in that the high breakdown voltage characteristic can be realized and the degrees of freedom of adjustment of the breakdown voltage are large. The inventors measured the breakdown voltage of the ESD protection device 11 actually and proved such advantages. The structure of the ESD protection device 11 which is subjected the measurement of the breakdown voltage is as follows. The semiconductor layer 12 is an IGZO film of 10 nm and a SiN film of 20-50 nm is used as the gate insulating film (the diffusion preventing layer 7-1). The gate length L and the gate width W are 0.6 μm. The source electrode 15 and the drain electrode 16 overlap with the gate electrode 13 and the overlap lengths $d_{OL1}$ and $d_{OL2}$ are 0.16 μm. As shown in FIG. 8A, in the condition that the gate electrode 13 and the source electrode 15 are fixedly connected in common to 0 V, a voltage bias is applied to the drain electrode 16. When the ESD protection device 11 is used as a gate-grounded type N-channel transistor, it is technically proper to measure the breakdown voltage in such a connection, because the gate electrode 13 and the source electrode 15 are connected in common.

Figure 8B:
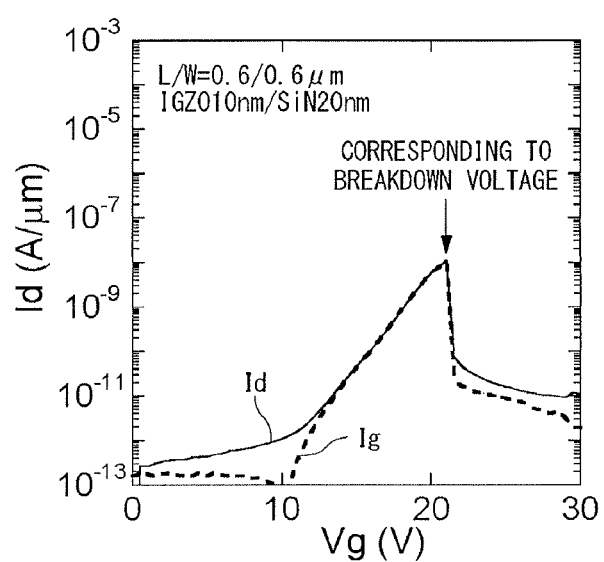
FIG. 8B is a graph showing a drain current characteristic of the ESD protection device which contains a SiN film of 20 nm as a gate insulating film.

FIG. 8B is a graph showing changes of the drain current Id and the gate current Ig according to a change of a voltage bias (drain voltage Vd) applied to the drain electrode 16 when the semiconductor layer 12 is the IGZO film of 10 nm and the gate insulating film (the diffusion preventing layer 7-1) is the SiN film of 20 nm. Increasing the drain voltage Vd, the ESD protection device 11 is destroyed at some voltage which is higher than 20 V, and the drain current Id and the gate current Ig increase rapidly and then reduce rapidly. A destruction mode was a break of the gate insulating film. That is, this measurement allows the breakdown voltage between the gate electrode and the drain electrode of the ESD protection device 11 to be measured, and indicates that the breakdown voltage between the source electrode and the drain electrode is higher than the breakdown voltage between the gate electrode and the drain electrode.

Figure 8C:
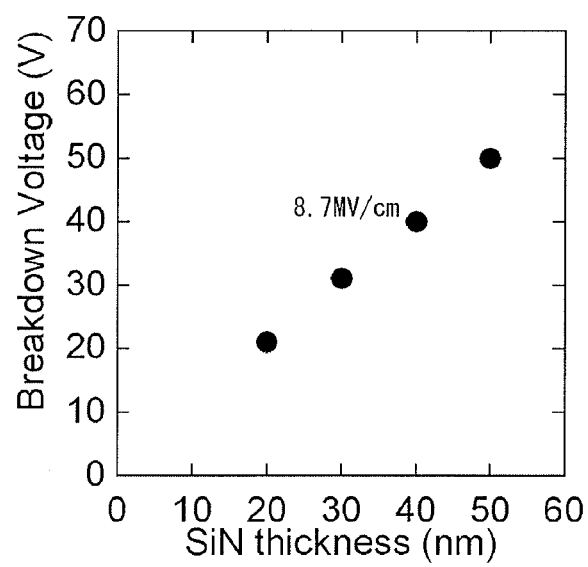
FIG. 8C is a graph showing a relation of the film thickness of the SiN film used as the gate insulating film and the breakdown voltage between a gate electrode and a drain electrode.

FIG. 8C is a graph showing a relation of the film thickness of the SiN film used as the gate insulating film and the breakdown voltage of the ESD protection device 11 measured in this way. By setting the film thickness of the SiN film to 20 nm, the breakdown voltage equal to or more than 20 V can be realized between the gate electrode to the drain electrode. Moreover, increasing the film thickness of the SiN film to 50 nm, it is possible to increase the breakdown voltage between the gate electrode and the drain electrode to about 50. Moreover, the ESD protection device 11 of the present embodiment can realize the breakdown voltage characteristic and have the large degrees of freedom of adjustment of the breakdown voltage. It should be noted that although the breakdown voltage of the ESD protection device 11 can be increased by increasing the film thickness of the SiN film, it is desirable that the film thickness of the SiN film is equal to or less than 100 nm, because the current which flows through the ESD protection device 11 becomes small if the film thickness of the SiN film is made too thick.

Figure 9A:
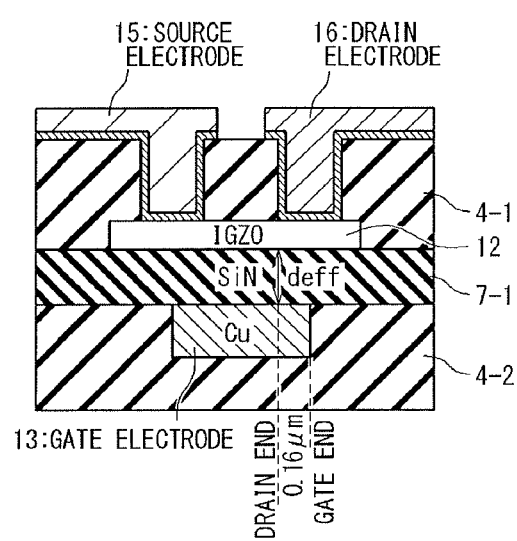
FIG. 9A is a sectional view showing the structure of the ESD protection device, in which a drain electrode overlaps with a gate electrode, of the ESD protection devices subjected to measurement.
Figure 9B:
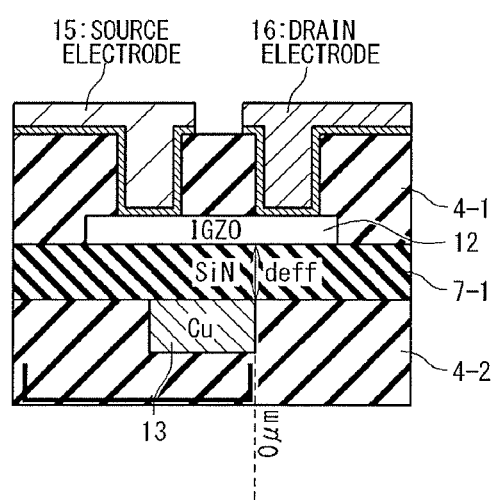
FIG. 9B is a sectional view showing the structure of the ESD protection device, in which the position of an end of the drain electrode coincides with the position of the end of the gate electrode in a plane structure, of the ESD protection devices subjected to the measurement.
Figure 9C:
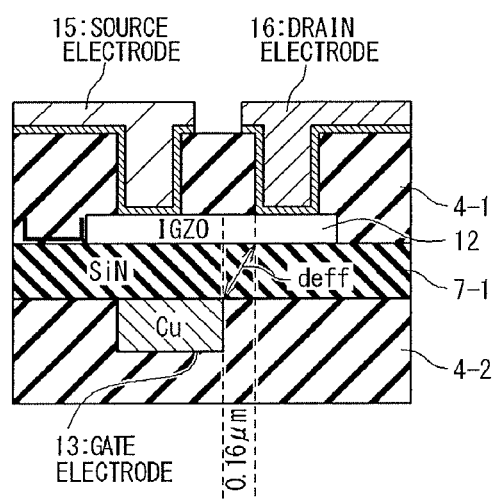
FIG. 9C is a sectional view showing the structure of the ESD protection device, in which the drain electrode does not overlap with the gate electrode, of the ESD protection devices subjected to the measurement.

The breakdown voltage between the gate electrode and the drain electrode can be increased by increasing a distance between the gate electrode 13 and the drain electrode 16 in the plane of the semiconductor layer 12 (that is, it is prevented the drain electrode 16 from overlapping above the gate electrode 13). The inventors proved the above matter by measuring the characteristics of the ESD protection device 11 actually made. FIG. 9A to FIG. 9C are sectional views showing the sectional structure of the ESD protection device 11. The drain electrode 16 overlaps with the gate electrode 13 in the structure of FIG. 9A, the end of the drain electrode 16 coincident with the end of the gate electrode 13 in the plane direction in the structure of FIG. 9B, and the drain electrode 16 does not overlap with the gate electrode 13 in the structure of FIG. 9C. It should be noted that in the structure (FIG. 9C) that the drain electrode 16 does not overlap with the gate electrode 13, a distance from the drain electrode 16 to the gate electrode 13 in the plane direction is defined as an overlap length of a negative value. Like cases of FIG. 8B and FIG. 8C, the semiconductor layer 12 is the IGZO film of 10 nm, and the SiN film of 20-50 nm is used as the gate insulating film (the diffusion preventing layer 7-1). The gate length L and the gate width W are 0.6 μm.

Figure 10A:
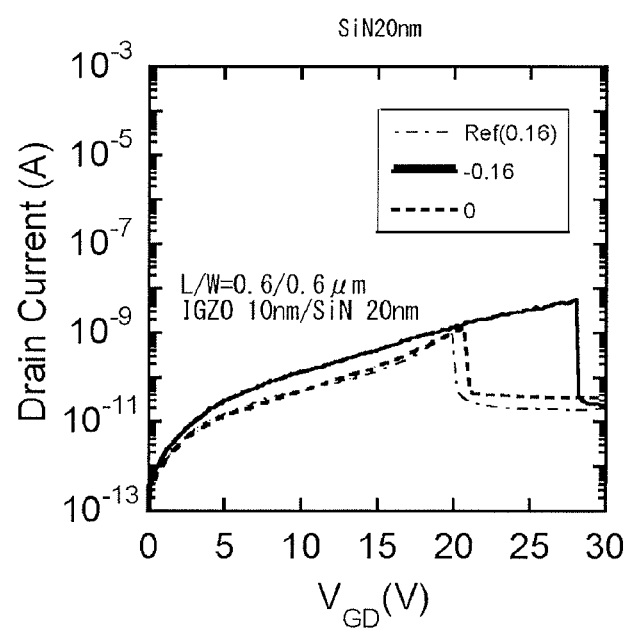
FIG. 10A is a graph showing a drain current characteristic of the ESD protection device which contains the SiN film of 20 nm as the gate insulating film and in which overlap lengths are 0.16 μm, 0.0 μm, and −0.16 μm.
Figure 10B:
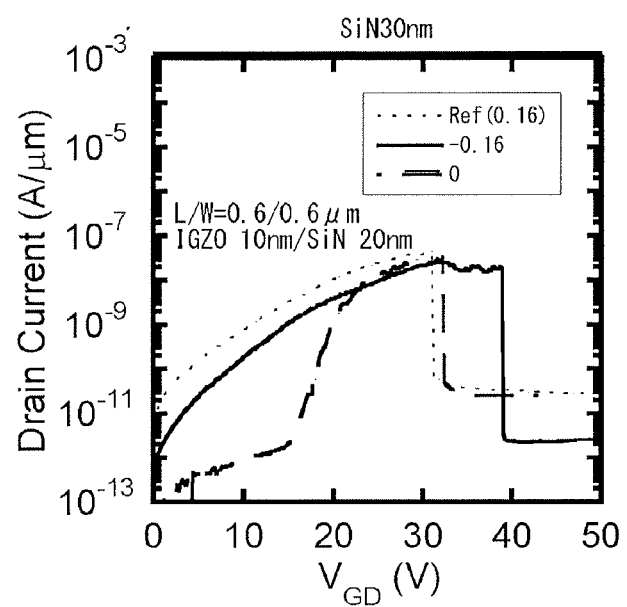
FIG. 10B is a graph showing the drain current characteristic of the ESD protection device which contains the SiN film of 30 nm as the gate insulating film and in which the overlap lengths re 0.16 μm, 0.0 μm, and −0.16 μm.
Figure 10C:
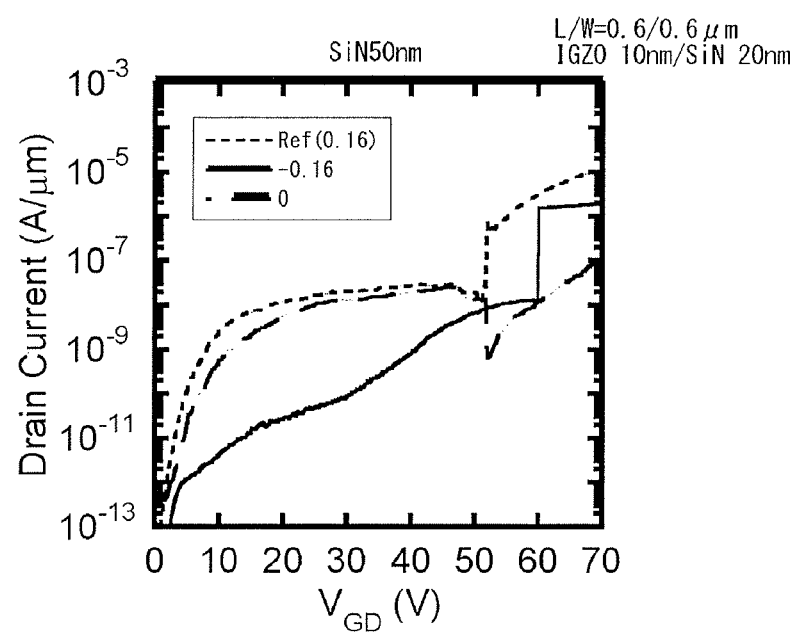
FIG. 10C is a graph showing the drain current characteristic of the ESD protection device which contains the SiN film of 50 nm as the gate insulating film and in which the overlap lengths are 0.16 μm, 0.0 μm, and −0.16 μm.

FIG. 10A, FIG. 10B, and FIG. 10C are graphs of the drain current characteristic when the film thickness of the SiN film is 20 nm, 30 nm, and 50 nm, respectively. One dot broken line indicates the drain current when the overlap length is 0.16 μm, the broken line indicates the drain current when the overlap length is 0.0 μm, and a solid line indicate the drain current when the overlap length is −0.16 μm (i.e. when any overlap does not occur). In the graph of the drain current characteristics, the voltage $V_{GD}$ between the gate electrode and the drain electrode where the drain current changes suddenly shows the breakdown voltage between the gate electrode and the drain electrode.

Figure 11:
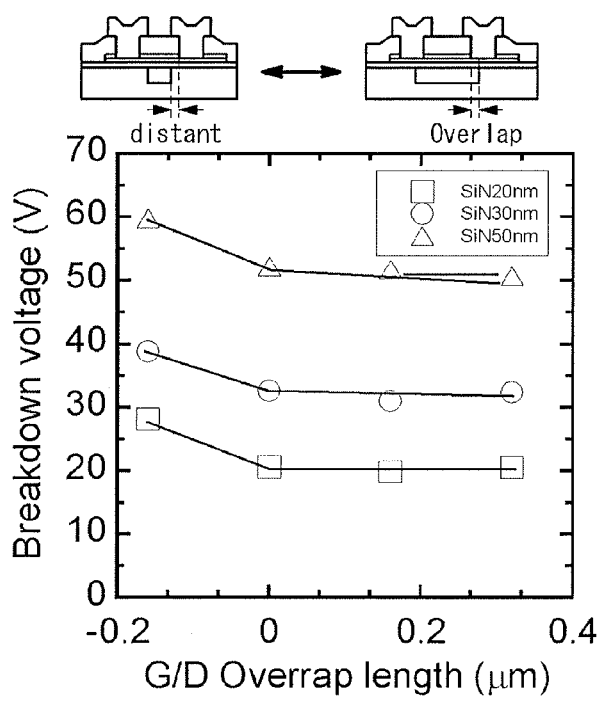
FIG. 11 is a graph showing a relation of the overlap lengths of the ESD protection device in FIG. 9A to FIG. 9C and a breakdown voltage between the gate electrode and the drain electrode.

FIG. 11 is a graph showing a relation of the breakdown voltage between the gate electrode and the drain electrode and the overlap length from the drain electrode 16 to the gate electrode 13. As understood from FIG. 11, the breakdown voltage between the gate electrode and the drain electrode does not depend on the overlap length in the structure that the drain electrode 16 overlaps with the gate electrode 13 and the structure that the end of the drain electrode 16 and the end of the gate electrode 13 coincide with each other in the plane direction. This is because the distance $d_{eff}$ between the drain electrode 16 and the gate electrode 13 (in the shortest length) is identical with the film thickness of the diffusion preventing layer 7-1. On the other hand, when the drain electrode 16 does not overlap with the gate electrode 13, the distance $d_{eff}$ between the drain electrode 16 and the gate electrode 13 increases. It is considered that the increase of the breakdown voltage between the gate electrode and the drain electrode is caused by the increase of the distance $d_{eff}$.

As described above, the embodiments of the present invention have been specifically described, but the present invention is not limited to the above-mentioned embodiments. The present invention can be implemented after various modifications are made by a person in the art. Especially, although the structure that the semiconductor layer 12 is provided for the uppermost wiring layer 3-1 is disclosed in FIG. 2, it should be noted that the semiconductor layer 12 may be provided in a suitable position if the semiconductor layer 12 is apart from the semiconductor substrate 1.

EXPLANATION OF THE CODE

10: semiconductor device
1: semiconductor substrate
2: semiconductor device
3: wiring layer
4: interlayer insulating film
5: wiring line
6: via
7: diffusion preventing layer
8: barrier metal layer
11: ESD protection device
12: semiconductor layer
13: gate electrode
14: hard mask layer
15: source electrode
16: drain electrode
17: ground pad
18: I/O pad
19: resistance element
21, 22, 23: wiring line
100: semiconductor device
101: semiconductor substrate
102: semiconductor element
103: wiring layer
104: wiring line
105: interlayer insulating film
106: via
107: ESD protection device
108, 109: wiring line
201, 202: ground pad
203: internal circuit
204: ESD surge
206: 207: internal circuit

The invention claimed is:
1. A semiconductor device comprising:
a semiconductor substrate on which a semiconductor element is formed;
first and second pads;
a first insulating film formed above the semiconductor substrate;
a plurality of wiring lines embedded in ditches provided in the first insulating film;
a second insulating film provided to cover the first insulating film and the plurality of wiring lines;
a semiconductor layer formed on the second insulating film;
a source electrode connected with the semiconductor layer and electrically connected with the first pad; and
a drain electrode connected with the semiconductor layer and electrically connected with the second pad, wherein the plurality of wiring lines includes a gate electrode provided in a position which is opposite to the semiconductor layer, and wherein the semiconductor layer, the source electrode, the drain electrode and the gate electrode configure an ESD protection device to discharge a current by ESD surge from the first pad to the second pad.

2. The semiconductor device according to claim 1, wherein the semiconductor layer is formed of any of InGaZnO, InZnO, ZnO, ZnAlO and ZnCuO.

3. The semiconductor device according to claim 1, wherein a contact portion where the drain electrode contacts the semiconductor layer does not overlap with the gate electrode in a direction perpendicular to the semiconductor substrate.

4. The semiconductor device according to claim 1, wherein a breakdown voltage between the gate electrode and the drain electrode is equal to or more than 20 V.

5. The semiconductor device according to claim 4, wherein the second insulating film is a SiN film.

6. The semiconductor device according to claim 5, wherein a film thickness of the second insulating film is between 20 nm and 100 nm.

7. The semiconductor device according to claim 1, further comprising:
a wiring line provided in a neighborhood of the ESD protection device to radiate heat.

8. The semiconductor device according to claim 1, wherein the gate electrode is located at a first side of the semiconductor layer, and the source electrode and the drain electrode contact a second side being opposite to the first surface of the semiconductor layer.

9. The semiconductor device according to claim 1, wherein the semiconductor element is a first MOSFET, and the semiconductor layer, the source electrode, the drain electrode and the gate electrode constitute a second MOSFET as the ESD protection device.

10. The semiconductor device according to claim 1, wherein the ESD protection device is above the semiconductor element.

11. The semiconductor device according to claim 1, wherein the ESD protection device and the semiconductor element are disposed in a logic region of the semiconductor device above the semiconductor element.

12. A semiconductor device including:
a semiconductor substrate including a semiconductor element area;
a first insulating film formed above the semiconductor substrate;
a gate electrode embedded in the first insulating film;
a second insulating film formed above the first insulating film and the gate electrode;
a semiconductor layer formed above the second insulating film and having a first surface located at the gate electrode;
a source electrode located at a second surface being opposite to the first of the semiconductor layer; and
a drain electrode located at the second surface of the semiconductor layer;
wherein the semiconductor layer, the source electrode, the drain electrode and the gate electrode configure an ESD protection device that is formed above the semiconductor element area.

13. The semiconductor device according to claim 12, wherein the semiconductor element area is an area for a first MOSFET and the semiconductor layer, the source electrode, the drain electrode and the gate electrode constitute a second MOSFET as the ESD protection device.

* * * * *